(12) United States Patent
Shim et al.

(10) Patent No.: US 7,622,325 B2
(45) Date of Patent: Nov. 24, 2009

(54) INTEGRATED CIRCUIT PACKAGE SYSTEM INCLUDING HIGH-DENSITY SMALL FOOTPRINT SYSTEM-IN-PACKAGE

(75) Inventors: IL Kwon Shim, Singapore (SG); Tsz Yin Ho, Singapore (SG); Dario S. Filoteo, Jr., Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 423 days.

(21) Appl. No.: 11/163,771

(22) Filed: Oct. 29, 2005

(65) Prior Publication Data

US 2007/0096282 A1    May 3, 2007

(51) Int. Cl.
*H01L 21/00* (2006.01)
(52) U.S. Cl. ............... 438/106; 438/113; 438/118; 438/126; 438/127; 257/738; 257/782; 257/783; 257/787; 257/E21.001
(58) Field of Classification Search .......... 438/124; 257/E21.001
See application file for complete search history.

(56) References Cited

U.S. PATENT DOCUMENTS

| | | | |
|---|---|---|---|
| 5,905,639 A | 5/1999 | Warren | 361/776 |
| 6,404,649 B1 | 6/2002 | Drake et al. | 361/782 |
| 6,454,364 B1* | 9/2002 | Niwa et al. | 303/152 |
| 6,583,503 B2 | 6/2003 | Akram et al. | 257/686 |
| 6,664,643 B2* | 12/2003 | Emoto | 257/777 |
| 6,781,222 B2 | 8/2004 | Wu et al. | 257/684 |
| 6,787,916 B2 | 9/2004 | Halahan | 257/777 |
| 6,873,035 B2* | 3/2005 | Watanabe et al. | 257/686 |
| 6,884,939 B2* | 4/2005 | Dishongh et al. | 174/534 |
| 7,023,085 B2* | 4/2006 | Pu | 257/724 |
| 7,056,766 B2* | 6/2006 | Shiu et al. | 438/106 |
| 7,154,760 B2* | 12/2006 | Konishi et al. | 361/783 |
| 7,161,249 B2* | 1/2007 | Shim et al. | 257/777 |
| 7,166,917 B2* | 1/2007 | Yang et al. | 257/724 |
| 2002/0140085 A1 | 10/2002 | Lee et al. | 257/724 |
| 2004/0067605 A1* | 4/2004 | Koizumi | 438/108 |
| 2006/0180938 A1* | 8/2006 | Kurihara et al. | 257/773 |

* cited by examiner

*Primary Examiner*—Charles D Garber
*Assistant Examiner*—Angel Roman
(74) *Attorney, Agent, or Firm*—Mikio Ishimaru (57) ABSTRACT

An integrated circuit package system including a high-density small footprint system-in-package with a substrate is provided. Passive components are mounted on the substrate. Solder separators are provided on the substrate, the solder separators having flattened tops at a predetermined height above the substrate. A die is supported on the solder separators above the substrate.

20 Claims, 14 Drawing Sheets

INTEGRATED CIRCUIT PACKAGE SYSTEM INCLUDING HIGH-DENSITY SMALL FOOTPRINT SYSTEM-IN-PACKAGE

TECHNICAL FIELD

The present invention relates generally to semiconductor technology, and more particularly to an integrated circuit package system including a high-density small footprint system-in-package.

BACKGROUND ART

Higher performance, lower cost, increased miniaturization of components, and greater packaging density of integrated circuits ("ICs") are ongoing goals of the computer industry. As new generations of IC products are released, the number of devices used to fabricate them tends to decrease due to advances in technology. Simultaneously, the functionality of these products increases. For example, on the average there is approximately a 10 percent decrease in components for every product generation over the previous generation with equivalent functionality.

In IC packaging, in addition to component reduction, surface mount technology ("SMT") has demonstrated an increase in semiconductor chip density on a single substrate despite the reduction in the number of components. SMT is a method used to connect packaged dies to substrates. With SMT, no through-holes in the board are required. Instead, package leads are soldered directly to the board surface. This results in more compact designs and form factors, and a significant increase in IC density and performance. However, despite these reductions in size, IC density continues to be limited by the space or "real estate" available for mounting dies on a substrate, such as a printed circuit board ("PCB").

One method to further increase IC density is to stack semiconductor dies vertically. Multiple stacked dies can be combined into a single package in this manner with a very small surface area or "footprint" on the substrate or PCB. In many cases, however, this requires customized die configurations. In these and other cases, passive devices (resistors, capacitors, etc.) that are associated with the dies are still variously mounted to the substrate usually around the peripheries of the dies, thus continuing to occupy valuable real estate.

Therefore, it would be advantageous to develop a stacking solution and assembly configuration for increasing IC density using non-customized (i.e., standard) die configurations with commercially-available, widely-practiced semiconductor device fabrication techniques. This is ever more critical as the semiconductor industry continues to demand semiconductor devices with lower costs, higher performance, increased miniaturization, and greater packaging densities. Substantially improved system-in-package ("SiP") solutions are greatly needed to address these requirements.

Typically, a SiP is assembled in a multichip module ("MCM") format, with multiple passive components mounted at the periphery of the semiconductor die. However, while stacked die packaging technologies have made it possible to even further reduce the substrate size for die attachment, the area for passive component attachment with SMT still needs to be reserved substantially at the top surface of the substrate. This greatly restricts and limits the potential for miniaturization that stacked die packaging might otherwise afford. The limitations are exacerbated by such peripheral placement of the passive components around the active components that are more in the center.

Thus, a need still remains for SiP systems that are capable of compactly integrating a plurality of passive components in combination with active components to achieve an optimal high-density small footprint for such composite semiconductor SiP systems. In view of the ever-increasing need to save costs and improve efficiencies, it is more and more critical that answers be found to these problems.

Solutions to these problems have been long sought but prior developments have not taught or suggested any solutions, and thus, solutions to these problems have long eluded those skilled in the art.

DISCLOSURE OF THE INVENTION

The present invention provides an integrated circuit package system including a high-density small footprint system-in-package. A substrate is provided and passive components are mounted on the substrate. Solder separators are provided on the substrate, the solder separators having flattened tops at a predetermined height above the substrate. A die is supported on the solder separators above the substrate.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, board and system configurations, and process steps are not disclosed in detail. Likewise, the drawings showing embodiments of the devices are semi-diagrammatic and not to scale and, particularly, some of the dimensions are for the clarity of presentation and are shown greatly exaggerated in the drawing FIGs. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the integrated circuit package substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
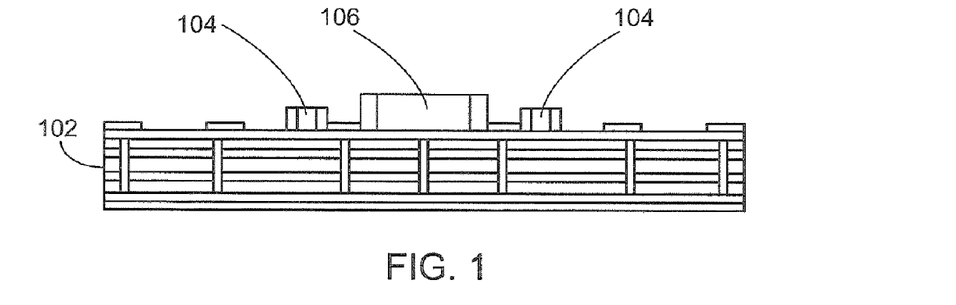
FIG. 1 is a cross-sectional view of a portion of a substrate in the early stages of fabrication of an integrated circuit package system.

Referring now to FIG. 1, therein is shown a cross-sectional view of a portion of a substrate 102 in the early stages of the fabrication of an integrated circuit ("IC") package system. Passive components 104 and 106 have been mounted on the substrate 102, for example, by conventional surface mounting, such as solder printing and computer pick/place ("P/P").

Figure 2:
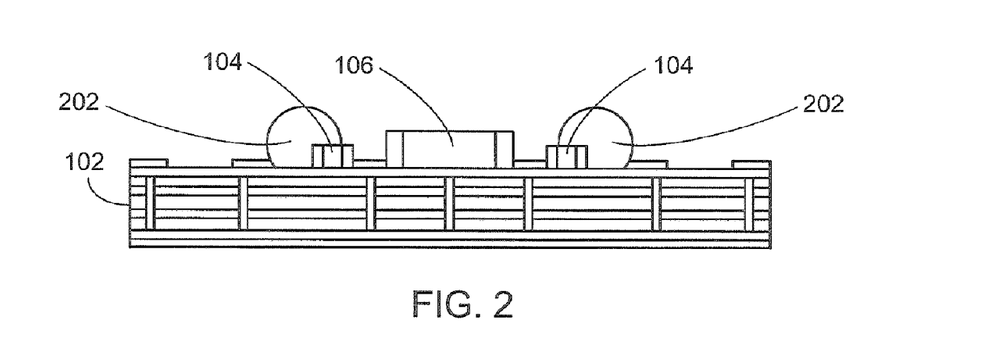
FIG. 2 is the structure of FIG. 1 with the addition of solder balls to the substrate.

Referring now to FIG. 2, therein is shown the structure of FIG. 1, on the top of which solder balls 202 have been added. The solder balls 202 may be provided on the substrate 102, for example, by conventional P/P followed by a reflow process, or by conventional solder paste printing and reflow.

Figure 3:
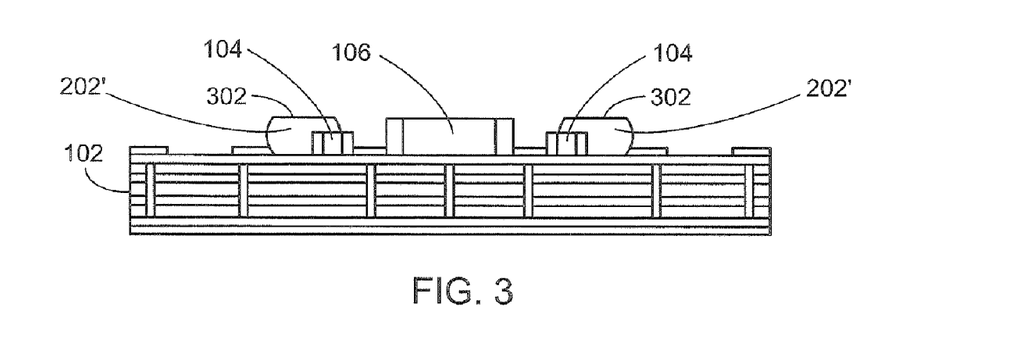
FIG. 3 is the structure of FIG. 2 after mechanical coining to flatten the tops of the solder balls.

Referring now to FIG. 3, therein is shown the structure of FIG. 2 following mechanical coining of the solder balls 202 (FIG. 2) to form flattened solder balls 202' that are flat on the tops 302 thereof. The coining is controlled to form the flattened tops 302 at a predetermined height above the substrate 102.

Figure 4:
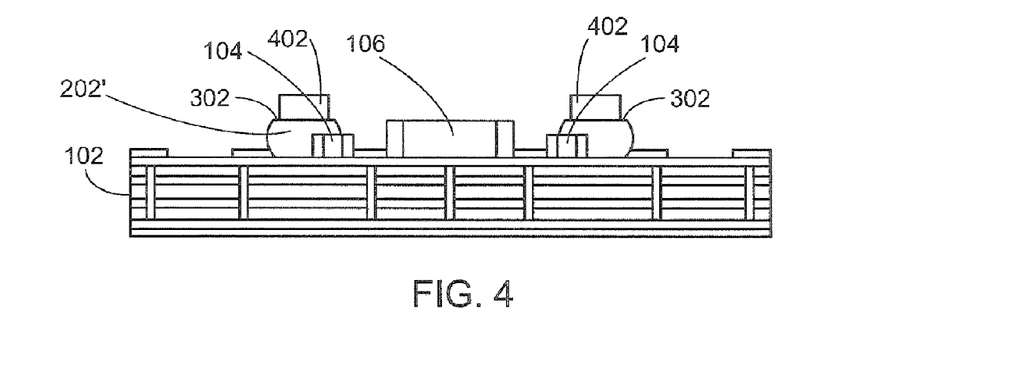
FIG. 4 is the structure of FIG. 3 after dispensing a conductive epoxy adhesive onto the tops of the flattened solder balls.

Referring now to FIG. 4, therein is shown the structure of FIG. 3 following dispensing of a conductive epoxy adhesive 402 onto the tops 302 of the flattened solder balls 202'.

Figure 5:
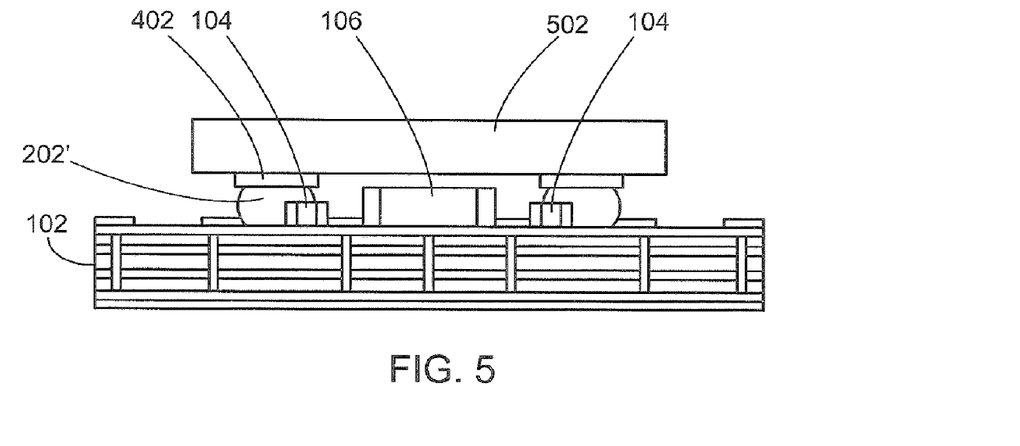
FIG. 5 is the structure of FIG. 4 after attaching a die onto the conductive epoxy adhesive.

Referring now to FIG. 5, therein is shown the structure of FIG. 4 following the attachment of a die 502 onto the conductive epoxy adhesive 402 and the curing of the conductive epoxy adhesive 402. The flattened solder balls 202' serve as solder separators between the substrate 102 and the die 502, and support the die 502 above the substrate 102.

Figure 6:
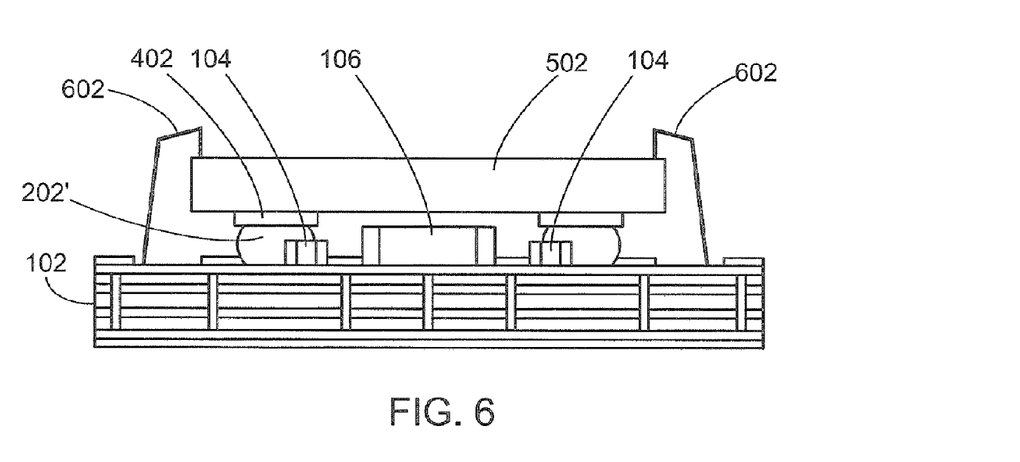
FIG. 6 is the structure of FIG. 5 following wire bonding of bond wires between the die and the substrate.

Referring now to FIG. 6, therein is shown the structure of FIG. 5 following wire bonding of bond wires 602 between the die 502 and the substrate 102.

Figure 7:
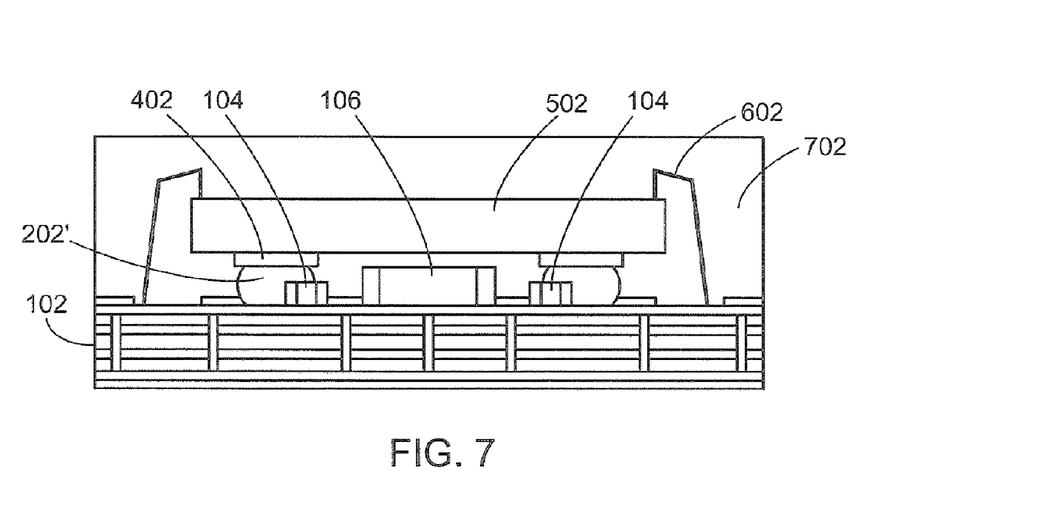
FIG. 7 is the structure of FIG. 6 after molding in a mold compound.

Referring now to FIG. 7, therein is shown the structure of FIG. 6 following molding thereof in a mold compound 702.

Figure 8:
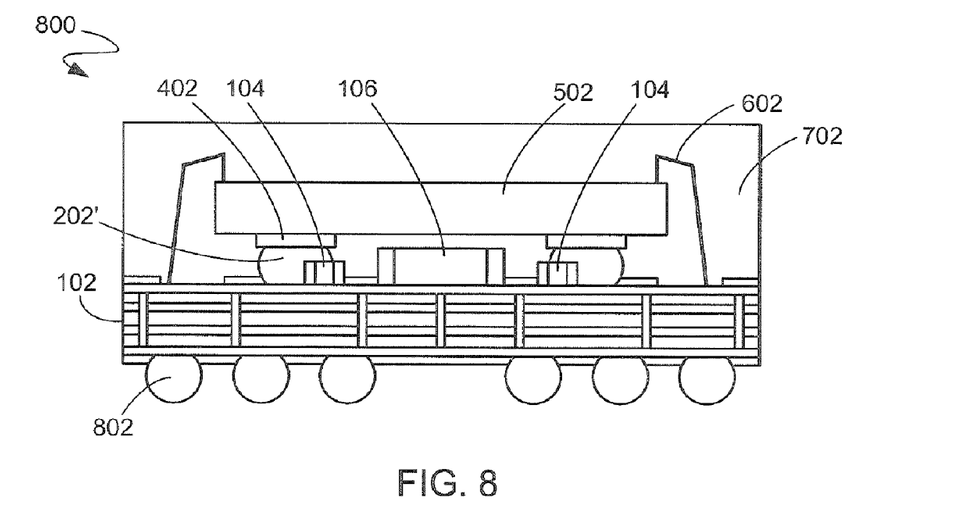
FIG. 8 is a cross-sectional view, taken on line 8-8 in FIG. 9, of an integrated circuit package formed from the structure of FIG. 7.
Figure 9:
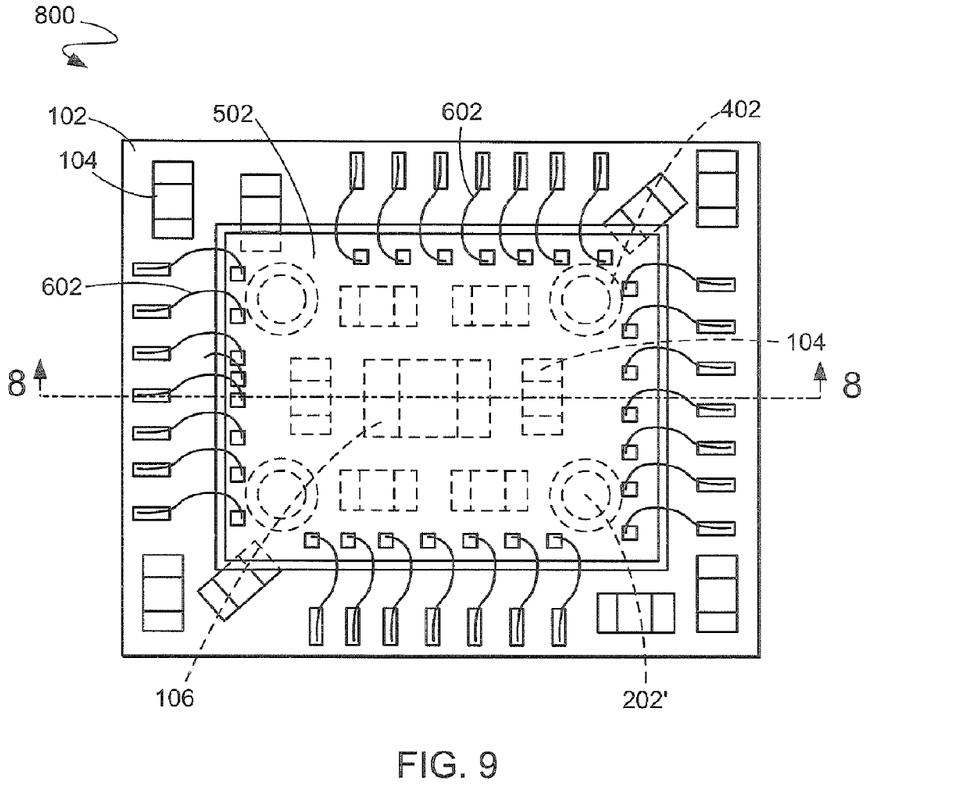
FIG. 9 is a top view of the integrated circuit package shown in FIG. 8.

Referring now to FIG. 8, therein is shown a cross-sectional view, taken on line 8-8 in FIG. 9, of an IC package 800 formed from the structure of FIG. 7 by mounting terminal solder balls 802 thereon, reflowing thereof, and singulation to form the IC package 800. The passive components 104 and 106 are under the die 502 and in the predetermined height established by the flattened solder balls 202'.

Referring now to FIG. 9, therein is shown a top view of the IC package 800 shown in FIG. 8.

It has been discovered that the IC package 800 has numerous advantages. For example, it maximizes the unit area utilization for passive component attachment. This is achieved by providing for attaching the passive components ("passives") under the active components ("actives")—for example, by attaching the passive components 104 and 106 under the die 502.

Another advantage is that the backside of the die 502 can be electrically grounded and thermally connected to the substrate 102 through the conductive epoxy adhesive 402 and the flattened solder balls 202'.

It has also been unexpectedly discovered that the coining of the flattened solder balls 202' provides for controlled height. It has additionally been discovered that the flattened tops 302 accommodate dies without resulting in shorting to other components in the IC package 800, and without producing tilting that might otherwise cause a wire-bonding problem. Moreover, the IC package 800 provides an extremely small footprint that results in lower system costs.

Figure 10:
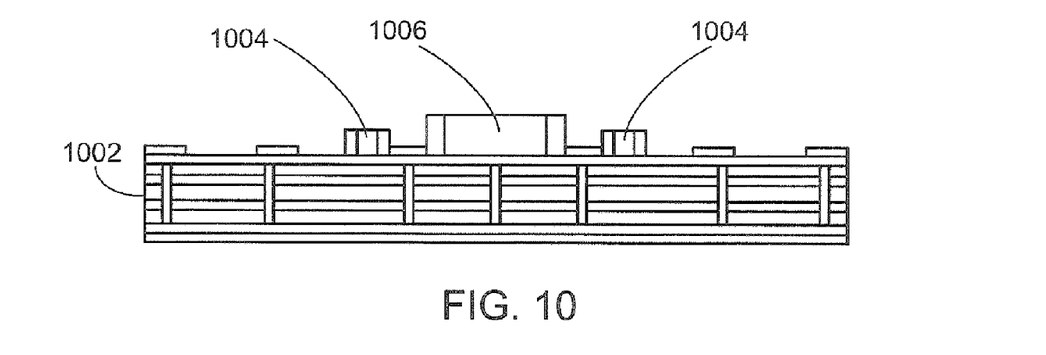
FIG. 10 is a cross-sectional view of a portion of a substrate in the early stages of the fabrication of an integrated circuit package system.

Referring now to FIG. 10, therein is shown a cross-sectional view of a portion of a substrate 1002 in the early stages of the fabrication of an IC package system. Passive components 1004 and 1006 have been mounted on the substrate 1002, for example, by conventional surface mounting, such as solder printing and computer P/P.

Figure 11:
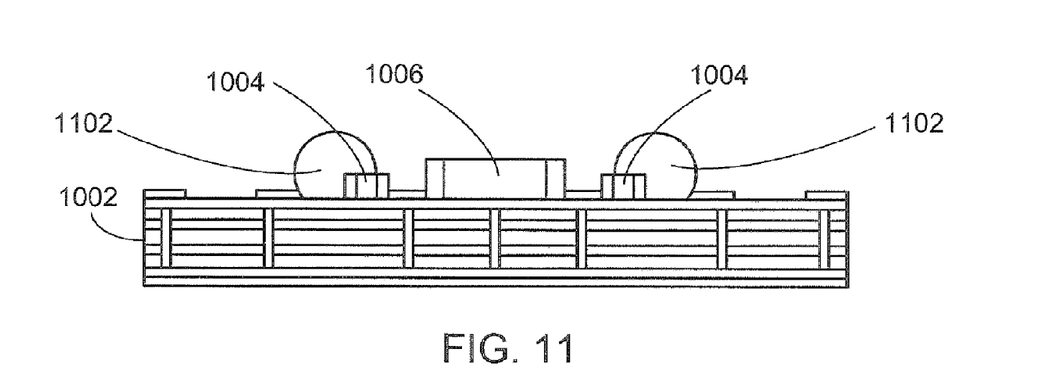
FIG. 11 is the structure of FIG. 10 with the addition of solder balls to the substrate.

Referring now to FIG. 11, therein is shown the structure of FIG. 10, on the top of which solder balls 1102 have been added. The solder balls 1102 may be provided on the substrate 1002, for example, by conventional P/P followed by a reflow process, or by conventional solder paste printing and reflow.

Figure 12:
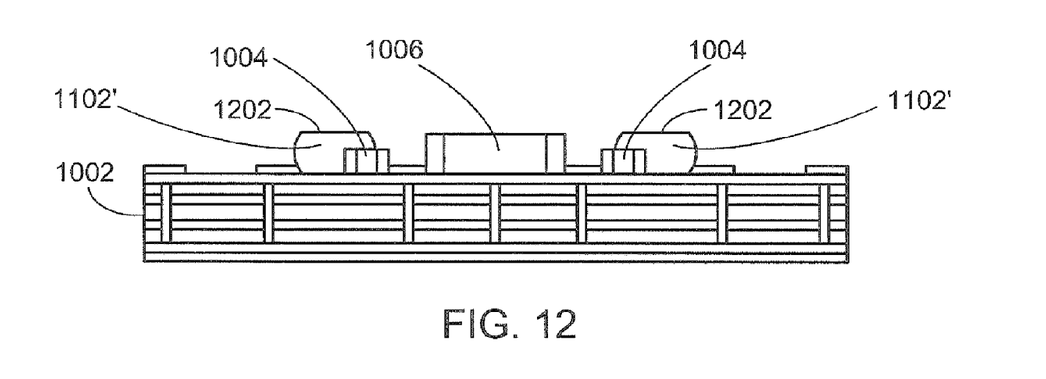
FIG. 12 is the structure of FIG. 11 after mechanical coining to flatten the tops of the solder balls.

Referring now to FIG. 12, therein is shown the structure of FIG. 11 following mechanical coining of the solder balls 1102 (FIG. 11) to form flattened solder balls 1102' that are flat on the tops 1202 thereof. The coining is controlled to form the flattened tops 1202 at a predetermined height above the substrate 1002.

Figure 13:
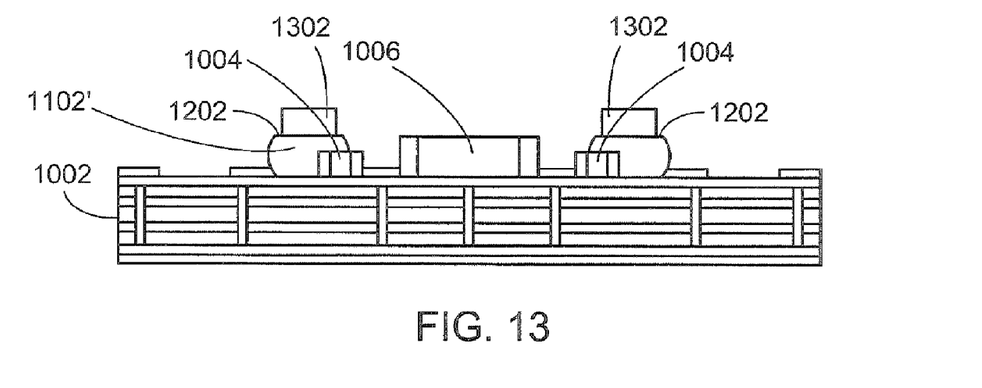
FIG. 13 is the structure of FIG. 12 after dispensing a conductive epoxy adhesive onto the tops of the flattened solder balls.

Referring now to FIG. 13, therein is shown the structure of FIG. 12 following dispensing of a conductive epoxy adhesive 1302 onto the tops 1202 of the flattened solder balls 1102'.

Figure 14:
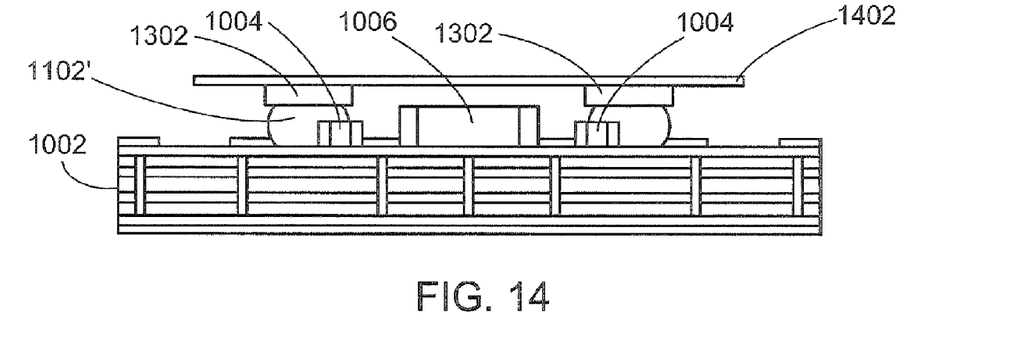
FIG. 14 is the structure of FIG. 13 after attaching a rigid conductive member to the conductive epoxy adhesive.

Referring now to FIG. 14, therein is shown the structure of FIG. 13 following attachment of a rigid conductive member 1402 to the conductive epoxy adhesive 1302, and curing thereof.

Figure 15:
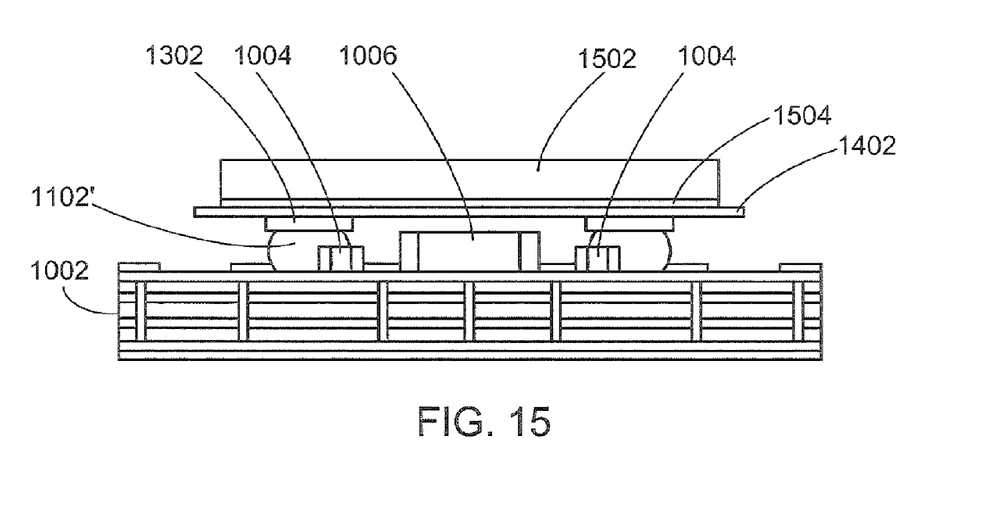
FIG. 15 is the structure of FIG. 14 after attaching a die to the rigid conductive member.

Referring now to FIG. 15, therein is shown the structure of FIG. 14 following attachment of a die 1502 to the rigid conductive member 1402 by means of an epoxy layer 1504 therebetween. Following attachment of the die 1502, the epoxy layer 1504 is then cured. The flattened solder balls 1102' serve as solder separators between the substrate 1002 and the die 1502, and support the die 1502 above the substrate 1002.

Figure 16:
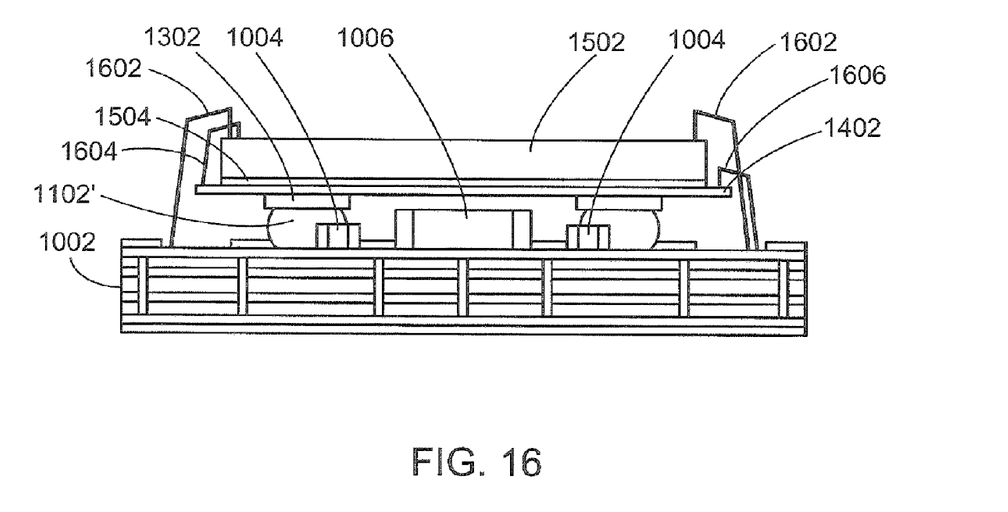
FIG. 16 is the structure of FIG. 15 following wire bonding thereof.

Referring now to FIG. 16, therein is shown the structure of FIG. 15 following wire bonding of bond wires 1602 between the die 1502 and the substrate 1002, bond wires 1604 between the rigid conductive member 1402 and the die 1502, and bond wires 1606 between the rigid conductive member 1402 and the substrate 1002.

Figure 17:
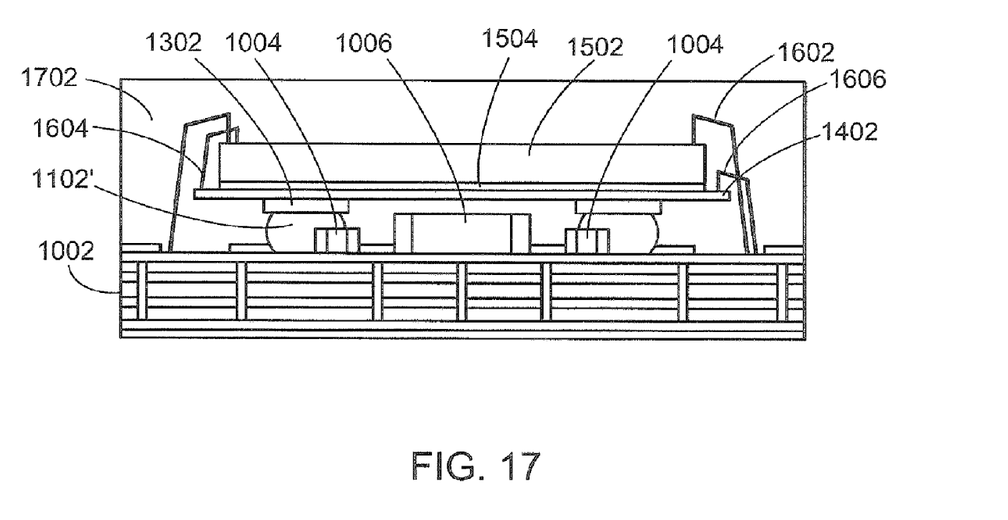
FIG. 17 is the structure of FIG. 16 following molding thereof in a mold compound.

Referring now to FIG. 17, therein is shown the structure of FIG. 16 following molding thereof in a mold compound 1702.

Figure 18:
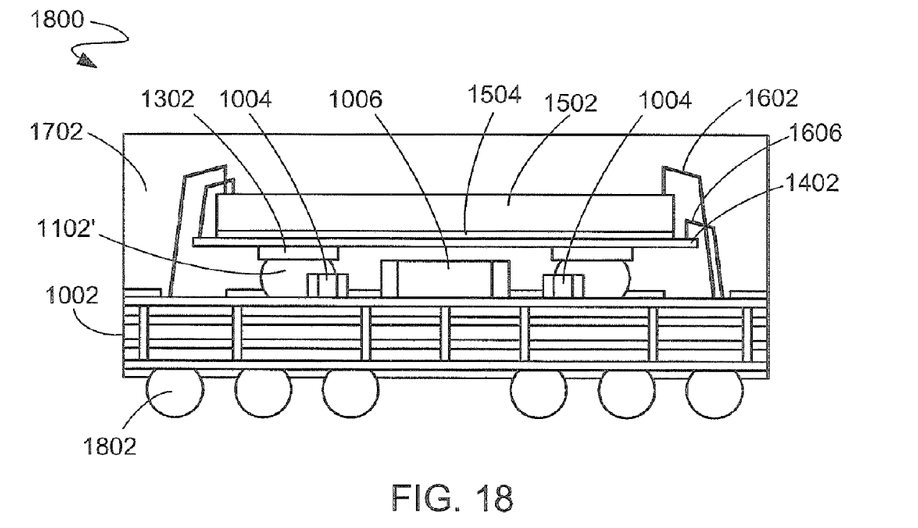
FIG. 18 is a cross-sectional view, taken on line 18-18 in FIG. 19, of an integrated circuit package formed from the structure of FIG. 17.
Figure 19:
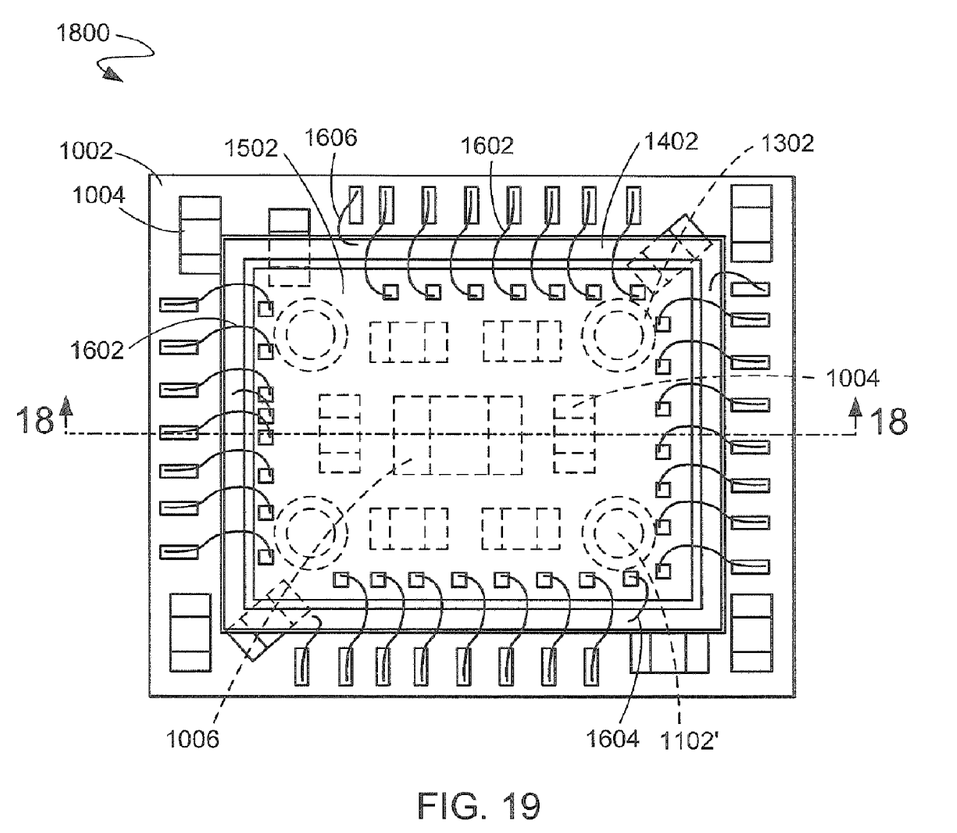
FIG. 19 is a top view of the integrated circuit package shown in FIG. 18.

Referring now to FIG. 18, therein is shown a cross-sectional view, taken on line 18-18 in FIG. 19, of an IC package 1800 formed from the structure of FIG. 17 by mounting terminal solder balls 1802 thereon, reflowing thereof, and singulation to form the IC package 1800.

Referring now to FIG. 19, therein is shown a top view of the IC package 1800 shown in FIG. 18.

It has been discovered that the IC package 1800 affords essentially the same unexpected benefits that are afforded by the IC package 800 (FIGS. 8 and 9). In addition, the IC package 1800 provides an additional rigid conductive member 1402, making it easier to afford a greater die attach area for accommodating multiple dies, such as the die 1502, configured for instance in a side-by-side manner. Further, the rigid conductive member 1402 also enables the backsides of the dies to be entirely grounded to the rigid conductive member 1402. Additionally, the rigid conductive member 1402 provides an added electrical ground plane that can afford a wire-bondable plating layer which allows for ready downbond and/or ground-bond registrations. Further, the rigid conductive member 1402 provides a heat sink functionality to improve heat dissipation efficiency, as well as providing a more stable wire-bonding platform.

Figure 20:
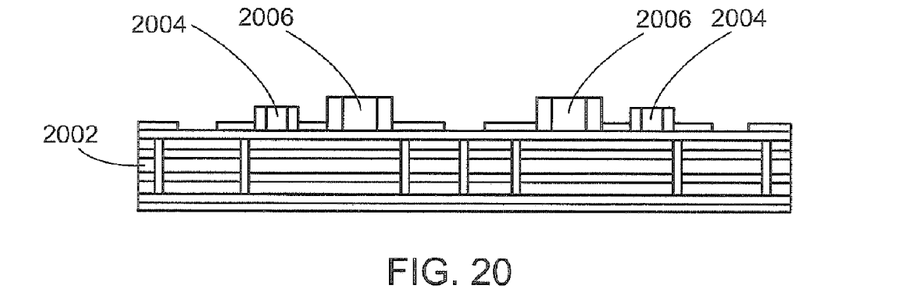
FIG. 20 is a cross-sectional view of a portion of a substrate in the early stages of the fabrication of an integrated circuit package system.

Referring now to FIG. 20, therein is shown a cross-sectional view of a portion of a substrate 2002 in the early stages of the fabrication of an IC package system. Passive components 2004 and 2006 have been mounted on the substrate 2002, for example, by conventional surface mounting, such as solder printing and computer P/P.

Figure 21:
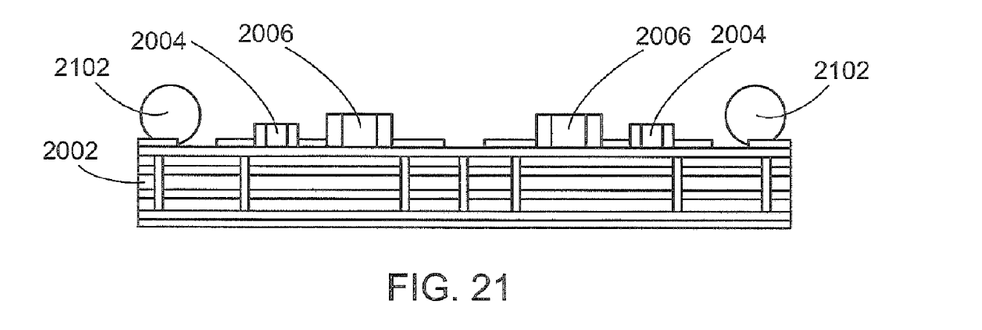
FIG. 21 is the structure of FIG. 20 with the addition of solder balls to the substrate.

Referring now to FIG. 21, therein is shown the structure of FIG. 20, on the top of which solder balls 2102 have been added. The solder balls 2102 may be provided on the substrate 2002, for example, by conventional P/P followed by a reflow process, or by conventional solder paste printing and reflow.

Figure 22:
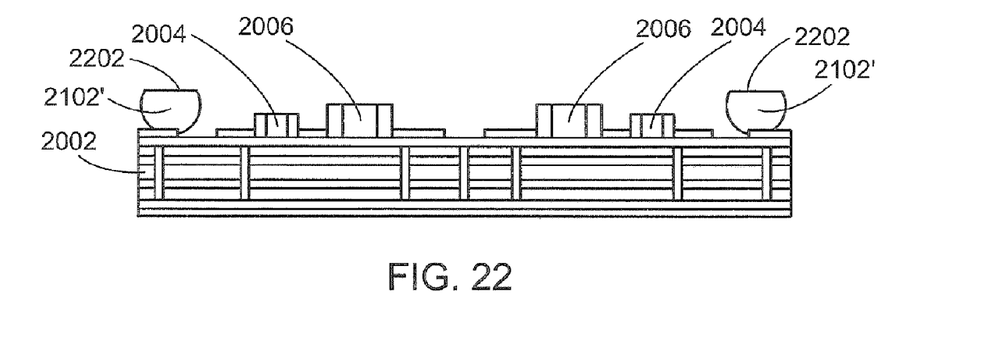
FIG. 22 is the structure of FIG. 21 after mechanical coining to flatten the tops of the solder balls.

Referring now to FIG. 22, therein is shown the structure of FIG. 21 following mechanical coining of the solder balls 2102 (FIG. 21) to form flattened solder balls 2102' that are flat on the tops 2202 thereof. The coining is controlled to form the flattened tops 2202 at a predetermined height above the substrate 2002.

Figure 23:
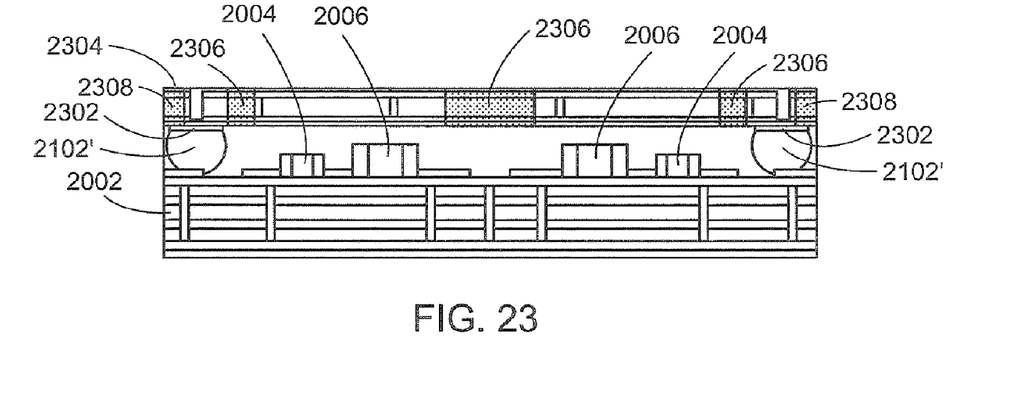
FIG. 23 is the structure of FIG. 22 after dispensing a conductive epoxy adhesive onto the tops of the flattened solder balls and attaching an interposer thereto.

Referring now to FIG. 23, therein is shown the structure of FIG. 22 following dispensing of a conductive epoxy adhesive 2302 onto the tops 2202 (FIG. 22) of the flattened solder balls 2102', and then attaching an interposer 2304 to the conductive epoxy adhesive 2302, and curing thereof. The interposer 2304 is also provided with center slots 2306 and edge slots 2308 that provide respective openings passing therethrough.

Figure 24:
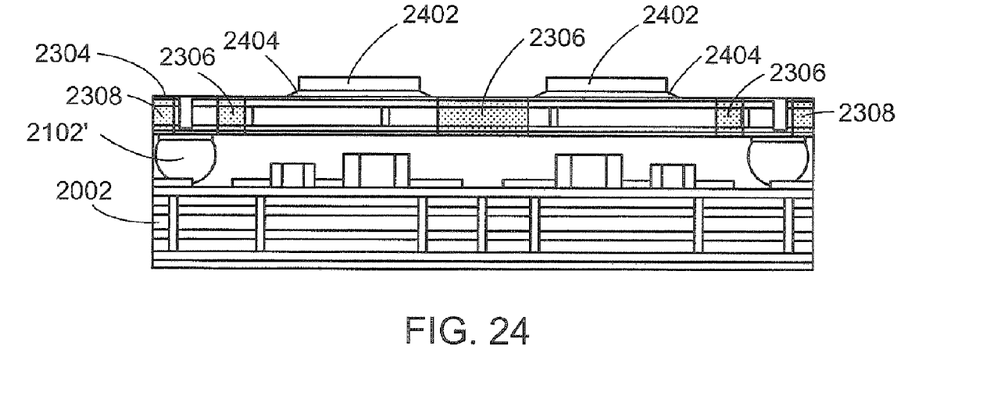
FIG. 24 is the structure of FIG. 23 after attaching dies to the interposer.

Referring now to FIG. 24, therein is shown the structure of FIG. 23 following attachment of dies 2402 to the interposer 2304 by means of an epoxy layer 2404 therebetween. Following attachment of the dies 2402, the epoxy layer 2404 is then cured. The flattened solder balls 2102' serve as solder separators between the substrate 2002 and the dies 2402, and support the dies 2402 above the substrate 2002.

Figure 25:
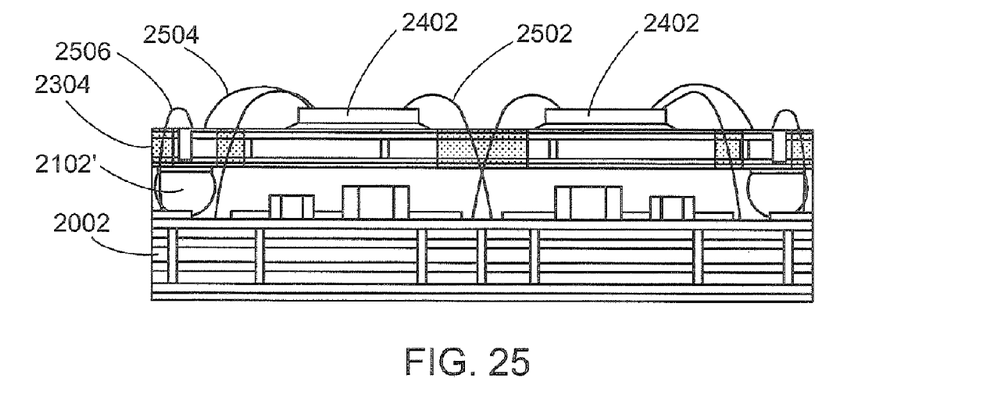
FIG. 25 is the structure of FIG. 24 following wire bonding thereof.

Referring now to FIG. 25, therein is shown the structure of FIG. 24 following wire bonding of bond wires 2502 between the dies 2402 and the substrate 2002, bond wires 2504 between the interposer 2304 and the dies 2402, and bond wires 2506 between the interposer 2304 and the substrate 2002.

Figure 26:
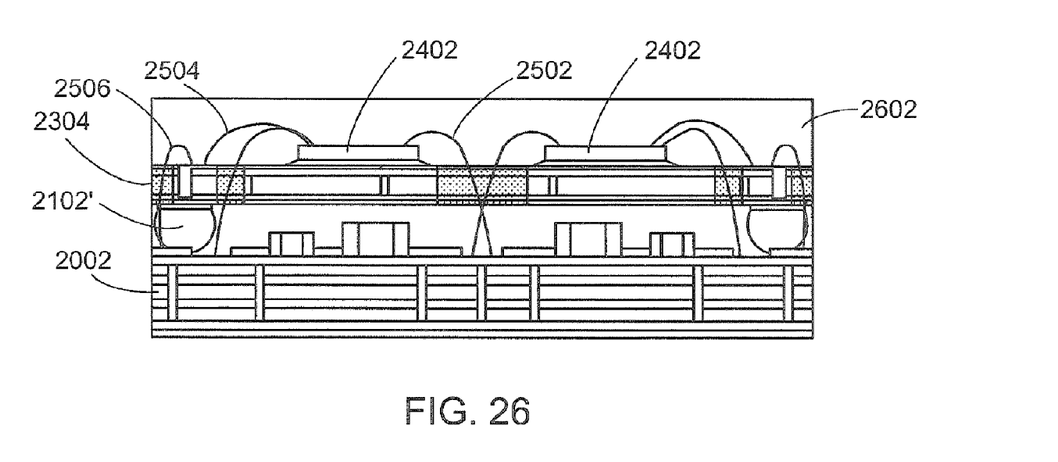
FIG. 26 is the structure of FIG. 25 following molding thereof in a mold compound.

Referring now to FIG. 26, therein is shown the structure of FIG. 25 following molding thereof in a mold compound 2602, followed by post mold curing.

Figure 27:
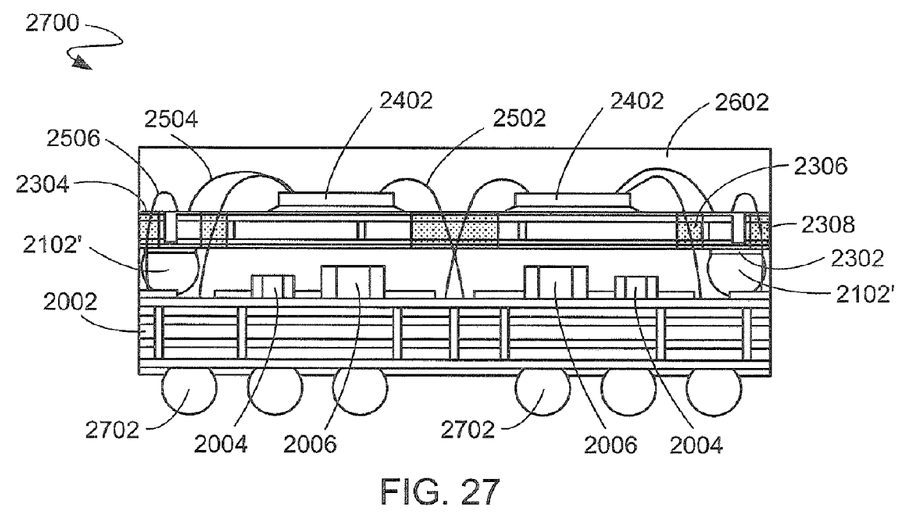
FIG. 27 is a cross-sectional view, taken on line 27-27 in FIG. 28, of an integrated circuit package formed from the structure of FIG. 26.
Figure 28:
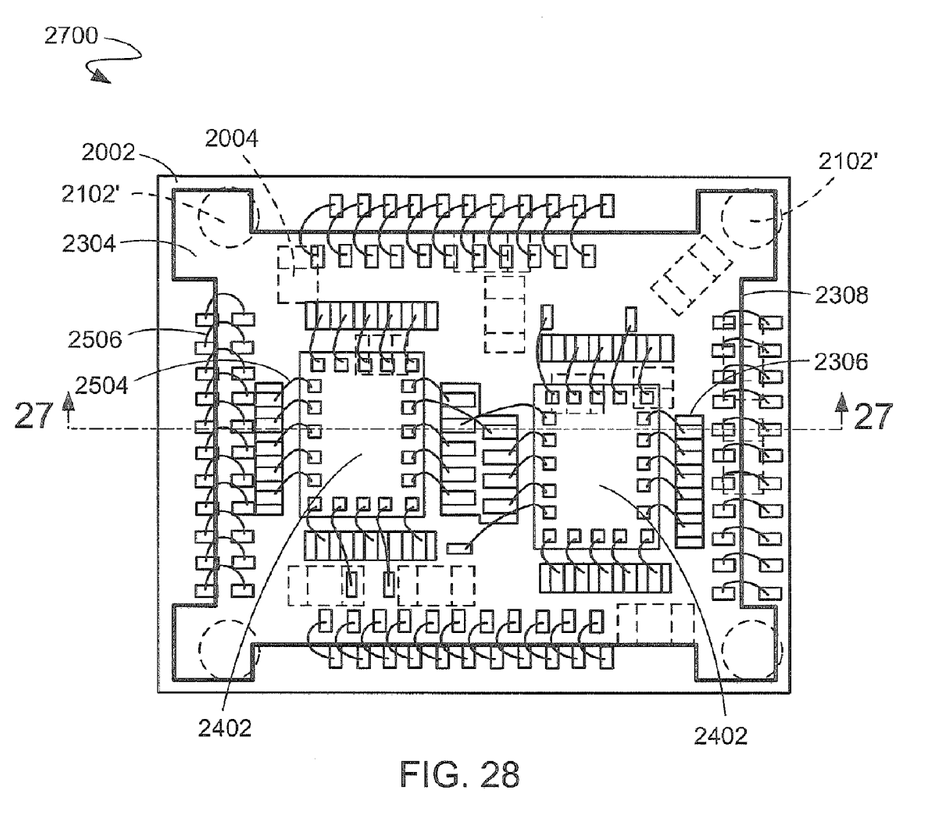
FIG. 28 is a top view of the integrated circuit package shown in FIG. 27.

Referring now to FIG. 27, therein is shown a cross-sectional view, taken on line 27-27 in FIG. 28, of an IC package 2700 formed from the structure of FIG. 26 by mounting terminal solder balls 2702 thereon, reflowing thereof, and singulation to form the IC package 2700.

Referring now to FIG. 28, therein is shown a top view of the IC package 2700 shown in FIG. 27.

It has been discovered that the IC package 2700 has not only the numerous and significant advantages described above with respect to the IC packages 800 and 1800, but provides additional unexpected advantages as well. For example, the configuration of the IC package 2700 provides a maximized unit area utilization for the attachment of passive components (e.g., the passive components 2004 and 2006 (FIG. 27)) located on the substrate 2002 underneath the interposer 2304. Additionally, the backside of the interposer 2304 may be formed of electrically conductive material, and may then be electrically grounded and thermally connected to the substrate 2002 through the flattened solder balls 2102'.

The IC package 2700 also affords controlled height to accommodate the interposer 2304 without potential shorting to other components, or tilting that might cause a wire bonding failure. Further, the IC package 2700 affords an extremely small footprint, resulting in lower overall system costs. Additionally, the interposer 2304 affords and provides for higher integration and for a bridge connection for the bottom substrate, such as the substrate 2002. Furthermore, the center slots 2306 and the edge slots 2308 in the interposer 2304 facilitate wire bonding and mold flow. Additionally, the edge slots 2308 greatly facilitate singulation of the IC packages 2700 by reducing the amount of interposer edge material that must be sawed during singulation.

Figure 29:
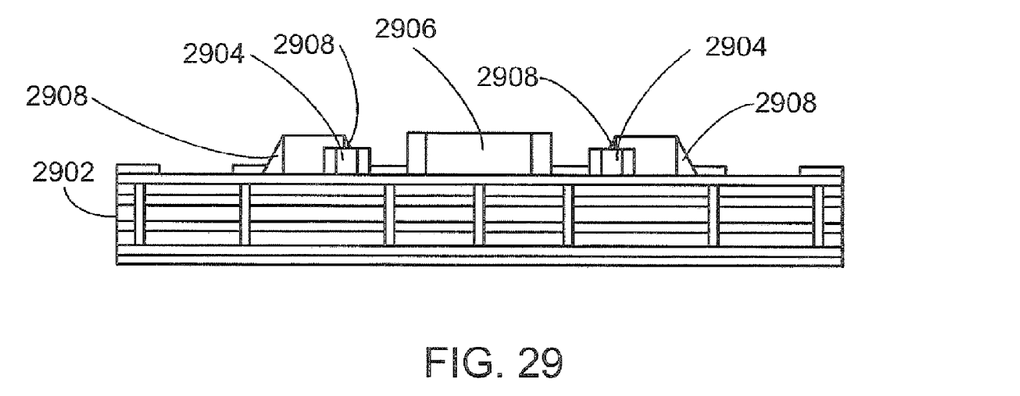
FIG. 29 is a cross-sectional view of a portion of a substrate in the early stages of the fabrication of an integrated circuit package system.

Referring now to FIG. 29, therein is shown a cross-sectional view of a portion of a substrate 2902 in the early stages of the fabrication of an IC package system. Passive components 2904 and 2906 have been mounted on the substrate 2902, for example, by conventional surface mounting, such as solder printing and computer P/P. Jumpers 2908 are also surface mounted on the substrate 2902.

Figure 30:
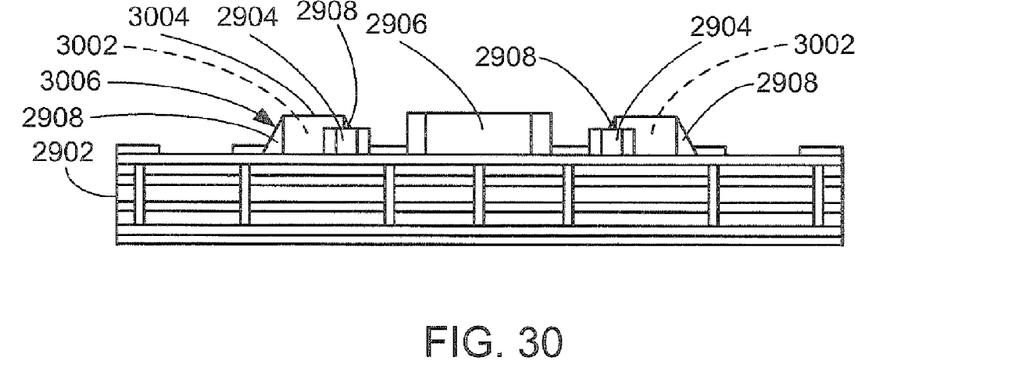
FIG. 30 is the structure of FIG. 29 with the addition of solder-filled jumpers having flat tops.

Referring now to FIG. 30, therein is shown the structure of FIG. 29 in which the jumpers 2908 have been filled with a solder paste, such as by solder printing, and the solder paste has been reflowed to form solder columns 3002, within the jumpers 2908, and having flat tops 3004. The combined jumpers 2908 and the solder columns 3002 therein form respective solder-filled jumpers 3006. The solder-filled jumpers 3006 are formed so that the flat tops 3004 thereof are at a predetermined height above the substrate 2902.

Figure 31:
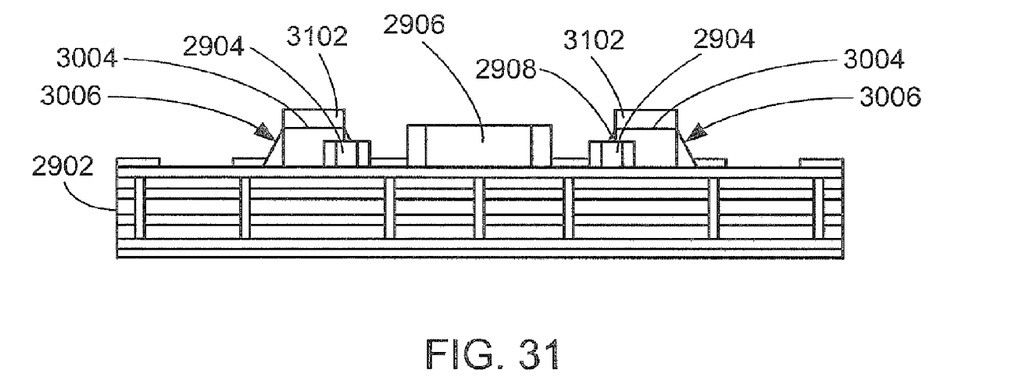
FIG. 31 is the structure of FIG. 30 after dispensing a conductive epoxy adhesive onto the flat tops of the solder-filled jumpers.

Referring now to FIG. 31, therein is shown the structure of FIG. 30 following dispensing of a conductive epoxy adhesive 3102 onto the flat tops 3004 of the solder-filled jumpers 3006.

Figure 32:
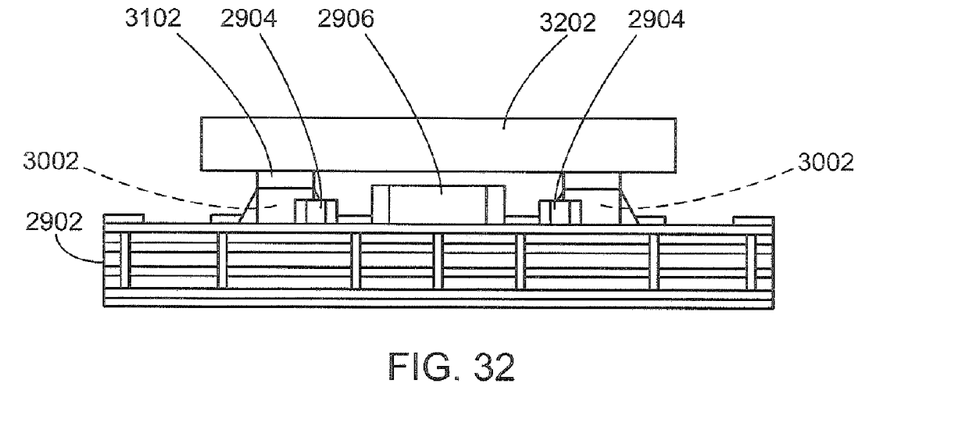
FIG. 32 is the structure of FIG. 31 after attaching a die onto the conductive epoxy adhesive.

Referring now to FIG. 32, therein is shown the structure of FIG. 31 following the attachment of a die 3202 onto the conductive epoxy adhesive 3102 and curing thereof. The solder columns 3002 serve as solder separators between the substrate 2902 and the die 3202, and support the die 3202 above the substrate 2902.

Figure 33:
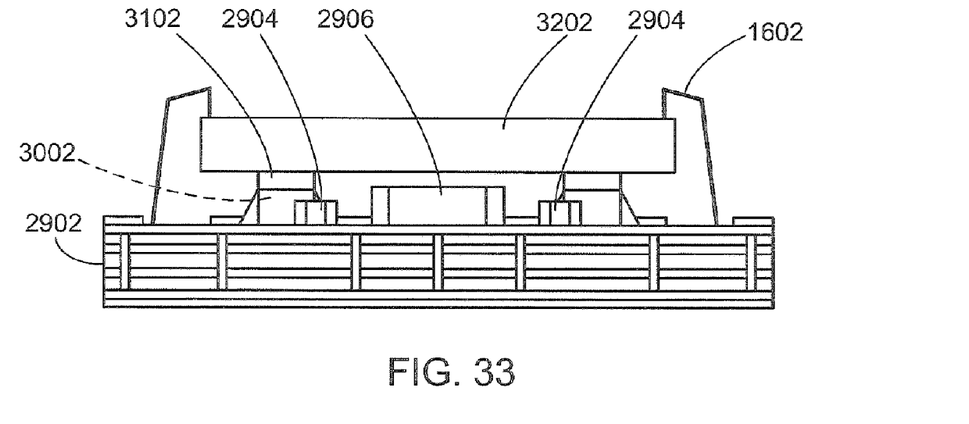
FIG. 33 is the structure of FIG. 32 following wire bonding of bond wires between the die and the substrate.

Referring now to FIG. 33, therein is shown the structure of FIG. 32 following wire bonding of bond wires 1602 between the die 3202 and the substrate 2902.

Figure 34:
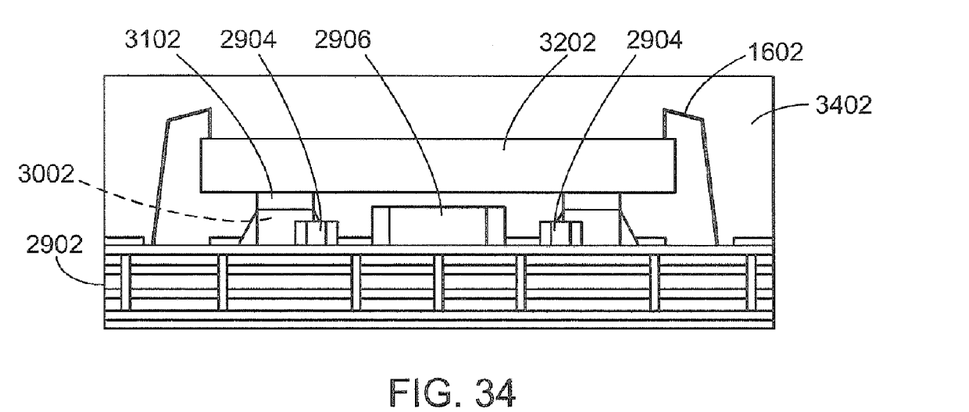
FIG. 34 is the structure of FIG. 33 following molding thereof in a mold compound.

Referring now to FIG. 34, therein is shown the structure of FIG. 33 following molding thereof in a mold compound 3402.

Figure 35:
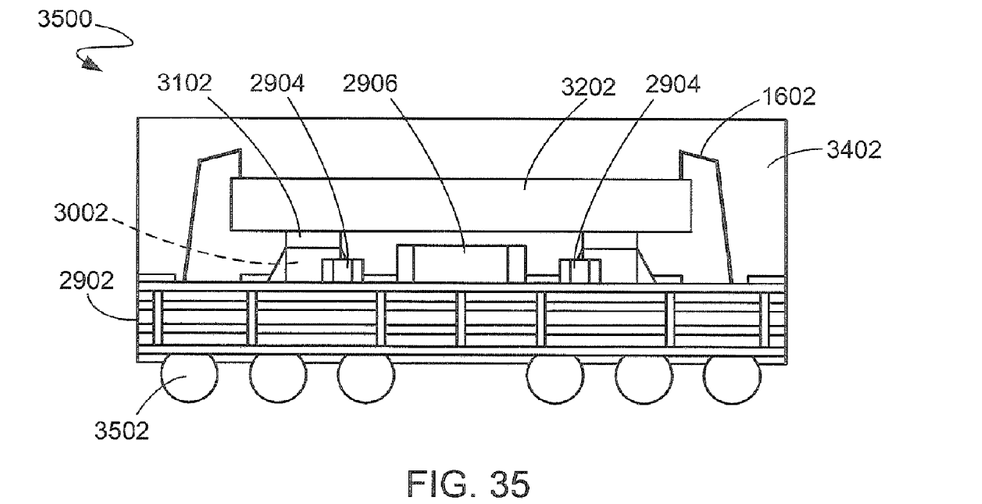
FIG. 35 is a cross-sectional view, taken along line 35-35 in FIG. 36, of an integrated circuit package formed from the structure of FIG. 34.
Figure 36:
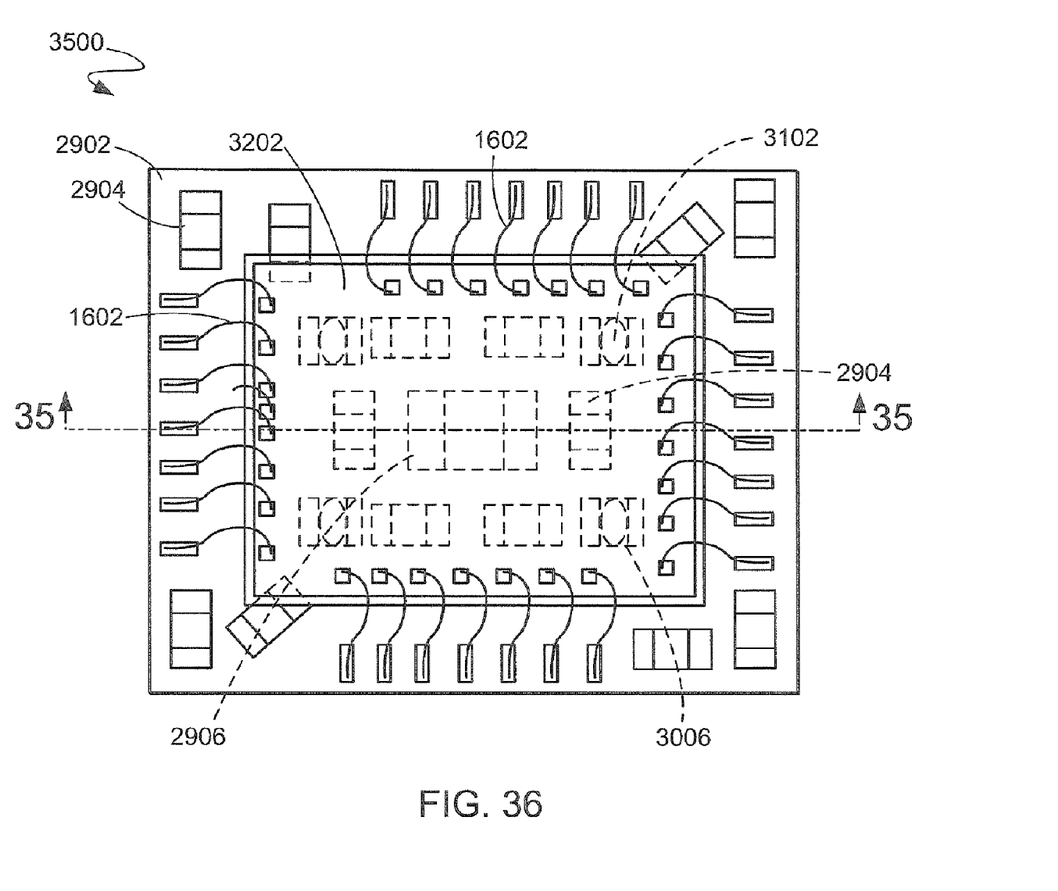
FIG. 36 is a top view of the integrated circuit package shown in FIG. 35.

Referring now to FIG. 35, therein is shown a cross-sectional view, taken on line 35-35 in FIG. 36, of an IC package 3500 formed from the structure of FIG. 34 by mounting terminal solder balls 3502 thereon, reflowing thereof, and singulation to form the IC package 3500.

Referring now to FIG. 36, therein is shown a top view of the IC package 3500 shown in FIG. 35.

It has been discovered that the IC package 3500, in addition to the several significant advantages provided by the IC packages 800, 1800, 2700, particularly affords maximized unit area utilization for passive component attachment through the provision of the solder-filled jumpers 3006 and the location of the passive components 2904 and 2906 beneath the dies, such as the die 3202. The IC package 3500 also affords the capability for die backside electrical grounding and thermal connection to the substrate 2902 through the conductive epoxy adhesive 3102. Once more, an extremely small footprint is thus afforded, resulting in lower system costs.

Figure 37:
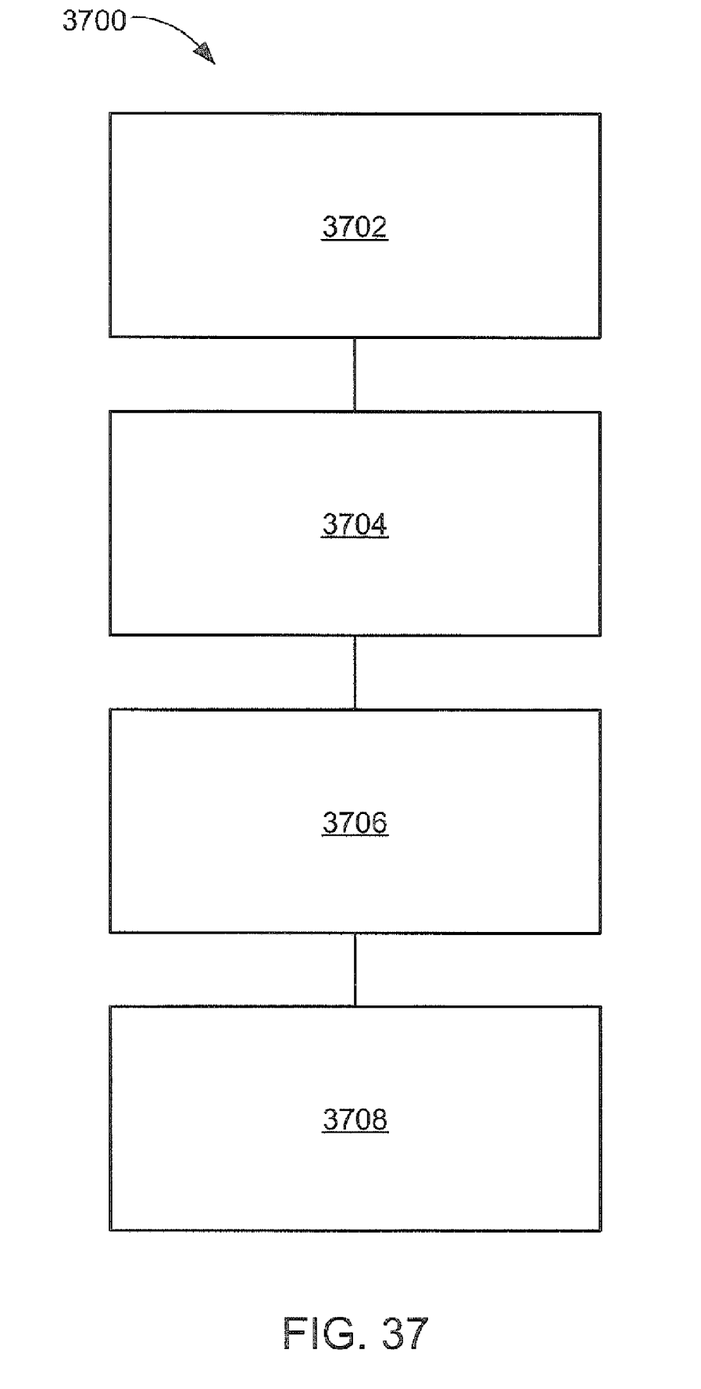
FIG. 37 is a flow chart of an integrated circuit package system including a high-density small footprint system-in-package in accordance with an embodiment of the present invention.

Referring now to FIG. 37, therein is shown a flow chart of an IC package system 3700 including a high-density small footprint SiP in accordance with an embodiment of the present invention. The IC package system includes providing a substrate, in a block 3702; mounting passive components on the substrate, in a block 3704; providing solder separators on the substrate, the solder separators having flattened tops at a predetermined height above the substrate, in a block 3706; and supporting a die on the solder separators above the substrate, in a block 3708.

It has been discovered that the present invention thus has numerous advantages.

A principle advantage of the present invention is that it provides SiP systems that compactly integrate a plurality of passive components in combination with active components, with multiple, separate SiP semiconductor substrates, achieving optimal high-density small footprints for such composite semiconductor device systems.

Another advantage is that coined solder balls can be mounted on a substrate and used as spacers, providing a cost-effective solution employing commonly used semiconductor materials in an uncommon and unobvious fashion.

Another advantage is that the solder balls and passive components can be mounted on a substrate simultaneously during a solder reflow process.

Still another advantage is that the flattened solder tops can be formed using conventional coining processes to provide precisely controlled heights above the substrate.

Yet another advantage is that a conductive epoxy can be readily dispensed on the flattened solder top surfaces for die attachment thereto.

Still another advantage is that the controlled-height flattened solder top surfaces prevent the occurrence of die tilting and wire shorting during and after wire bonding processes.

Yet another advantage is that the die backside can be electrically grounded and thermally connected to the substrate through the conductive adhesive and the coined solder balls.

Still another advantage is that thermal expansion mismatches between the die and the substrate are substantially reduced due to the small contact area between the die and the coined solder balls.

Yet another advantage is that a metal plate, a rigid conductive member, or a laminate interposer may be attached to coined solder balls prior to attachment of a semiconductor die. In such cases, no additional solder reflow process is required to mount these elements to the coined solder balls.

Still another advantage of the present invention is that the coined solder balls may be disposed on the bottom substrate at any desired location, either within or outside the footprint of the semiconductor die itself.

Another advantage is that a plurality of slots may be formed in a top interposer to facilitate wire bonding between dies and the bottom substrate, facilitate mold flow, and facilitate saw singulation.

Yet another advantage is that jumper components can also be used as spacers, can be surface mounted together with passive components, and can be filled with solder during a common solder reflow process.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention, that provides such a high-density small footprint SiP, furnishes important and heretofore unknown and unavailable solutions, capabilities, and functional advantages for composite SiP semiconductor device systems. The resulting processes and configurations are straightforward, cost-effective, uncomplicated, highly versatile and effective, can be implemented by adapting known technologies, and are thus readily suited for efficiently and economically manufacturing SiP semiconductor devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of making an integrated circuit package system including a high-density small footprint system-in-package, comprising:
   providing a substrate;
   providing solder separators on the substrate, the solder separators having flattened tops at a predetermined height above the substrate;
   coupling a backside of a die, electrically and thermally, through the solder separators to the substrate;
   mounting passive components on the substrate under the die in the predetermined height.

2. The method as claimed in claim 1 wherein providing solder separators further comprises providing coined solder balls.

3. The method as claimed in claim 1 wherein providing solder separators further comprises providing solder-filled jumpers.

4. The method as claimed in claim 1 further comprising providing a rigid conductive member between the die and the solder separators.

5. The method as claimed in claim 1 further comprising providing a slotted interposer between the die and the solder separators.

6. A method of making an integrated circuit package system including a high-density small footprint system-in-package, comprising:
   providing a substrate;
   providing solder separators on the substrate, the solder separators having flattened tops at a predetermined height above the substrate;
   dispensing a conductive adhesive on the tops of the flattened tops;
   surface mounting passive components on the substrate in the predetermined height;
   coupling a backside of a die, electrically and thermally, to the conductive adhesive and supporting the die on the solder separators, above the substrate and the passive components;
   curing the conductive adhesive;
   wire bonding the die to the substrate;
   encapsulating the substrate, the passive components, and the die in a molding compound; and
   singulating the encapsulated die, passive components, and substrate to form a package.

7. The method as claimed in claim 6 wherein providing solder separators further comprises providing solder balls that are coined to provide flattened tops at a predetermined height above the substrate.

8. The method as claimed in claim 6 wherein providing solder separators further comprises providing jumpers that are solder-filled to provide flattened tops at a predetermined height above the substrate.

9. The method as claimed in claim 6 further comprising providing a rigid conductive member attached to the solder separators and supporting the die thereon.

10. The method as claimed in claim 6 further comprising providing a slotted interposer attached to the solder separators and supporting the die thereon with at least portions of the wire-bonding passing through the slotted interposer.

11. An integrated circuit package system including a high-density small footprint system-in-package, comprising:
   a substrate;
   solder separators on the substrate, the solder separators having flattened tops at a predetermined height above the substrate;
   a die coupled, electrically and thermally, on the backside through the solder separators to the substrate;
   passive components mounted on the substrate under the die in the predetermined height.

12. The system as claimed in claim 11 wherein the solder separators further comprise coined solder balls.

13. The system as claimed in claim 11 wherein the solder separators further comprise solder-filled jumpers.

14. The system as claimed in claim 11 further comprising a rigid conductive member between the die and the solder separators.

15. The system as claimed in claim 11 further comprising a slotted interposer between the die and the solder separators.

16. An integrated circuit package system including a high-density small footprint system-in-package, comprising:
   a substrate;
   solder separators on the substrate, the solder separators having flattened tops at a predetermined height above the substrate;
   passive components surface mounted on the substrate in the predetermined height;
   cured conductive adhesive on the tops of the flattened tops;
   a die coupled electrically and thermally by the backside to the cured conductive adhesive and supported on the solder separators, above the substrate and the passive components;
   the die being wire bonded to the substrate;
   a molding compound encapsulating the substrate, the passive components, and the die; and
   the encapsulated die, passive components, and substrate being singulated to form a package.

17. The system as claimed in claim 16 wherein the solder separators further comprise solder balls that are coined to provide flattened tops at a predetermined height above the substrate.

18. The system as claimed in claim 16 wherein the solder separators further comprise jumpers that are solder-filled to provide flattened tops at a predetermined height above the substrate.

19. The system as claimed in claim 16 further comprising a rigid conductive member attached to the solder separators and supporting the die thereon.

20. The system as claimed in claim 16 further comprising a slotted interposer attached to the solder separators and supporting the die thereon with at least portions of the wire-bonding passing through the slotted interposer.

* * * * *